United States Patent
Kim et al.

(10) Patent No.: US 7,808,043 B2
(45) Date of Patent: Oct. 5, 2010

(54) SEMICONDUCTOR DEVICE AND METHODS OF FABRICATING THE SAME INCLUDING FORMING SPACERS AND ETCH STOP LAYERS WITH STRESS PROPERTIES

(75) Inventors: Ki-Chul Kim, Suwon-si (KR); Dong-Suk Shin, Yongin-si (KR); Yong-Kuk Jeong, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 638 days.

(21) Appl. No.: 11/525,024

(22) Filed: Sep. 22, 2006

(65) Prior Publication Data
US 2007/0158704 A1    Jul. 12, 2007

(30) Foreign Application Priority Data
Jan. 10, 2006    (KR) .................. 10-2006-0002835

(51) Int. Cl.
| H01L 29/74 | (2006.01) |
| H01L 29/94 | (2006.01) |
| H01L 31/062 | (2006.01) |
| H01L 31/113 | (2006.01) |
| H01L 31/119 | (2006.01) |
| H01L 21/8238 | (2006.01) |
| H01L 21/4763 | (2006.01) |

(52) U.S. Cl. .............. 257/344; 438/230; 438/634; 438/791
(58) Field of Classification Search .......... 438/230, 438/634, 791; 257/344, E21.293
See application file for complete search history.

(56) References Cited

U.S. PATENT DOCUMENTS

| 5,472,890 | A | * | 12/1995 | Oda ................... 438/305 |
| 5,989,978 | A | * | 11/1999 | Peidous .............. 438/436 |
| 2003/0011017 | A1 | * | 1/2003 | Lee et al. ............ 257/314 |
| 2006/0249794 | A1 | * | 11/2006 | Teh et al. ............ 257/369 |

FOREIGN PATENT DOCUMENTS

| JP | 2003-060201 | 2/2003 |
| KR | 10-2005-0027851 | 3/2005 |
| KR | 10-2005-0051173 | 6/2005 |

* cited by examiner

*Primary Examiner*—William M. Brewster
(74) *Attorney, Agent, or Firm*—Harness, Dickey & Pierce, P.L.C.

(57) ABSTRACT

A semiconductor device having an etch stop layer and a method of fabricating the same are provided. The semiconductor device may include a substrate and a first gate electrode formed on the substrate. An auxiliary spacer may be formed on the sidewall of the first gate electrode. An etch stop layer may be formed on the substrate having the auxiliary spacer. The etch stop layer and the auxiliary spacer may be formed of a material having a same stress property.

24 Claims, 4 Drawing Sheets

SEMICONDUCTOR DEVICE AND METHODS OF FABRICATING THE SAME INCLUDING FORMING SPACERS AND ETCH STOP LAYERS WITH STRESS PROPERTIES

PRIORITY STATEMENT

This application claims the benefit of priority under 35 U.S.C. §119 from Korean Patent Application No. 2006-0002835, filed Jan. 10, 2006, in the Korean Intellectual Property Office (KIPO), the disclosure of which is hereby incorporated herein by reference in its entirety.

BACKGROUND OF THE INVENTION

1. Field of the Invention

Example embodiments of the present invention relate to a semiconductor device and methods of fabricating the same. Other example embodiments of the present invention relate to a semiconductor device having an etch stop layer and methods of fabricating the same.

2. Description of the Related Art

Generally, a MOS transistor may be used as a discrete element of a semiconductor device. In recent years, semiconductor devices have become more highly integrated. Because of the more highly integrated semiconductor devices, the MOS transistor has decreased in size. In forming contact plugs electrically connected to source/drain regions of the MOS transistor, it is known that a silicon nitride layer may function as an etch stop layer for contact holes. The silicon nitride layer may be formed on a substrate having the MOS transistor formed thereon. The prior art acknowledges that a silicon nitride layer having a relatively low stress may be used to form an etch stop layer to increase a current driving capability of an NMOS transistor.

During the formation of the etch stop layer, it may be difficult to form the etch stop layer having both a more uniform thickness and a desired stress property. In other words, even when the etch stop layer is formed having a desired stress property, problems may occur when attempting to control the thickness of the etch stop layer.

It may be desirous to fabricate a semiconductor device, including an etch stop layer with a more uniform thickness and desired stress property, having increased transistor characteristics.

SUMMARY OF THE INVENTION

Example embodiments of the present invention relate to a semiconductor device and methods of fabricating the same. Other example embodiments of the present invention relate to a semiconductor device having an etch stop layer and methods of fabricating the same.

Example embodiments of the present invention also relate to a semiconductor device capable of increasing performance of a transistor by controlling a thickness of an etch stop layer formed on a substrate having a gate electrode and methods of fabricating the same.

In accordance with example embodiments of the present invention, a semiconductor device is formed having an etch stop layer. The semiconductor device may include a substrate and a first gate electrode formed on the substrate. An auxiliary spacer may be formed on the sidewall of the first gate electrode. An etch stop layer may be formed on the substrate having the auxiliary spacer. The etch stop layer and the auxiliary spacer may be formed of a material layer having a same stress property. A first gate spacer may be formed between the first gate electrode and the auxiliary spacer.

First source/drain regions may be formed in the substrate at both sides of the first gate electrode. The first source/drain regions may have n-type conductivity.

The auxiliary spacer and the etch stop layer may be formed of a tensile silicon nitride layer.

A total thickness, including a thickness of the auxiliary spacer and a thickness of the etch stop layer on the sidewall of the first gate electrode, may be equal to or greater than a thickness of the etch stop layer on an upper surface of the first gate electrode.

The semiconductor device may further include a second gate electrode formed on the substrate and spaced apart from the first gate electrode on the substrate. The etch stop layer may be formed on the second gate electrode. A second gate spacer may be interposed between the second gate electrode and the etch stop layer.

Second source/drain regions may be formed in the substrate at sides of the second gate electrode. The second source/drain regions may have p-type conductivity.

In other example embodiments of the present invention, methods of fabricating a semiconductor device having an etch stop layer are provided.

According to example embodiments of the present invention, a semiconductor device may be fabricated by forming a gate electrode on a substrate and forming an auxiliary spacer on the sidewall of the gate electrode. An etch stop layer may be formed on the substrate having the auxiliary spacer formed thereon. The etch stop layer and the auxiliary spacer may be formed of a material having a same stress property.

The auxiliary spacer and the etch stop layer may be formed of tensile silicon nitride. The auxiliary spacer and the etch stop layer may be formed using a plasma enhanced chemical vapor deposition (PECVD) method.

Prior to forming the auxiliary spacer, a preliminary gate spacer may be formed on the sidewall of the gate electrode and etched to reduce, or remove, the preliminary gate spacer. The preliminary gate spacer may be formed using a low pressure chemical vapor deposition (LPCVD) method.

Prior to etching the preliminary gate spacer, a protecting layer may be formed on the substrate having the preliminary gate spacer formed thereon. The protecting layer may be partially etched to expose the preliminary gate spacer. The protecting layer may be removed prior to forming the etch stop layer.

Prior to forming the gate electrode, an isolation layer may be formed including a liner insulating layer in the substrate. The liner insulating layer may be a silicon nitride layer. The protecting layer may be a silicon oxide layer.

A total thickness, including a thickness of the auxiliary spacer and a thickness of the etch stop layer on the sidewall of the gate electrode, may be equal to or greater than a thickness of the etch stop layer on the upper surface of the gate electrode.

Prior to forming the auxiliary spacer, source/drain regions may be formed in the substrate at sides of the gate electrode. The source/drain regions may have n-type conductivity.

In accordance with example embodiments of the present invention, another method of fabricating a semiconductor device having an etch stop layer is provided. The method may include forming a first gate electrode and a second gate electrode on different regions of a substrate. An auxiliary spacer may be formed on the sidewall of the first gate electrode. An etch stop layer may be formed on the substrate having the auxiliary spacer formed thereon. The etch stop layer and the auxiliary spacer may be formed of a material having a same stress property. The auxiliary spacer and the etch stop layer may be a tensile silicon nitride layer.

Prior to forming the auxiliary spacer, a first preliminary gate spacer may be formed on the sidewalls of the first gate electrode and a second gate spacer may be formed on the sidewall of the second gate electrode. The first preliminary gate spacer may be etched to remove the first preliminary gate spacer. The first preliminary gate spacer may be partially etched such that a portion of the first preliminary gate spacer remains.

First source/drain regions and second source/drain regions may be formed in the substrate at sides of the first gate electrode and the second gate electrode, respectively. The first source/drain regions may have n-type conductivity and the second source/drain regions may have p-type conductivity.

BRIEF DESCRIPTION OF THE DRAWINGS

Example embodiments of the present invention will be more clearly understood form the following detailed description taken in conjunction with the accompanying drawings.

FIGS. 1 through 7 are diagrams illustrating sectional views of a method of fabricating a semiconductor device according to example embodiments of the present invention.

FIG. 8 is a diagram illustrating a sectional view of a semiconductor device according to example embodiments of the present invention.

DETAILED DESCRIPTION OF EXAMPLE EMBODIMENTS

Figure 1:
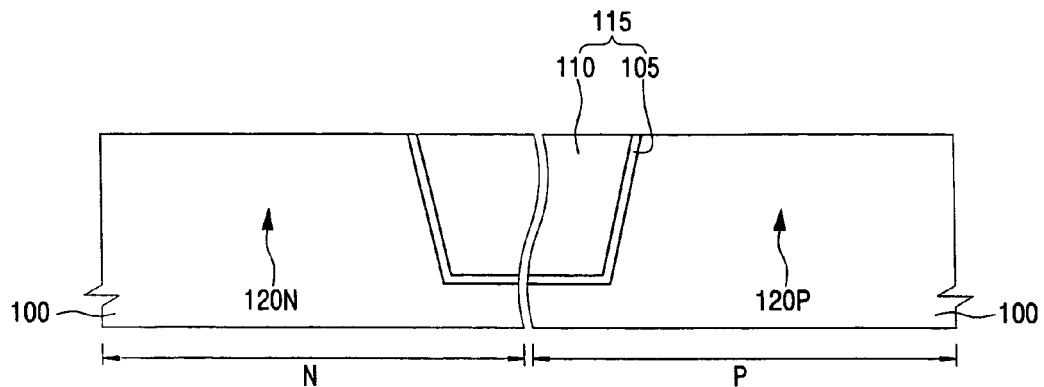
FIGS. 1-8 represent non-limiting, example embodiments of the present invention as described herein.

Various example embodiments of the present invention will now be described more fully with reference to the accompanying drawings in which some example embodiments of the invention are shown. In the drawings, the thicknesses of layers and regions may be exaggerated for clarity.

Detailed illustrative embodiments of the present invention are disclosed herein. However, specific structural and functional details disclosed herein are merely representative for purposes of describing example embodiments of the present invention. This invention may, however, may be embodied in many alternate forms and should not be construed as limited to only the embodiments set forth herein.

Accordingly, while example embodiments of the invention are capable of various modifications and alternative forms, embodiments thereof are shown by way of example in the drawings and will herein be described in detail. It should be understood, however, that there is no intent to limit example embodiments of the invention to the particular forms disclosed, but on the contrary, example embodiments of the invention are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the scope of example embodiments of the present invention.

Spatially relative terms, such as "beneath", "below", "lower", "above", "upper" and the like, may be used herein for ease of description to describe one element or a feature's relationship to another element or feature as illustrated in the Figures. It will be understood that the spatially relative terms are intended to encompass different orientations of the device in use or operation in addition to the orientation depicted in the Figures. For example, if the device in the Figures is turned over, elements described as "below" or "beneath" other elements or features would then be oriented "above" the other elements or features. Thus, for example, the term "below" can encompass both an orientation which is above as well as below. The device may be otherwise oriented (rotated 90 degrees or viewed or referenced at other orientations) and the spatially relative descriptors used herein should be interpreted accordingly.

Example embodiments of the present invention are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments of the invention should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope of the present invention.

It should also be noted that in some alternative implementations, the functions/acts noted may occur out of the order noted in the FIGS. For example, two FIGS. shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments of the present invention belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In order to more specifically describe example embodiments of the present invention, various aspects of the present invention will be described in detail with reference to the attached drawings. However, the present invention is not limited to the example embodiments described.

Example embodiments of the present invention relate to a semiconductor device and methods of fabricating the same. Other example embodiments of the present invention relate to a semiconductor device having an etch stop layer and methods of fabricating the same.

Example embodiments of the present invention also relate to a semiconductor device capable of increasing performance of a transistor by controlling a thickness of an etch stop layer formed on a substrate having a gate electrode and a method of fabricating the same.

Figure 8:
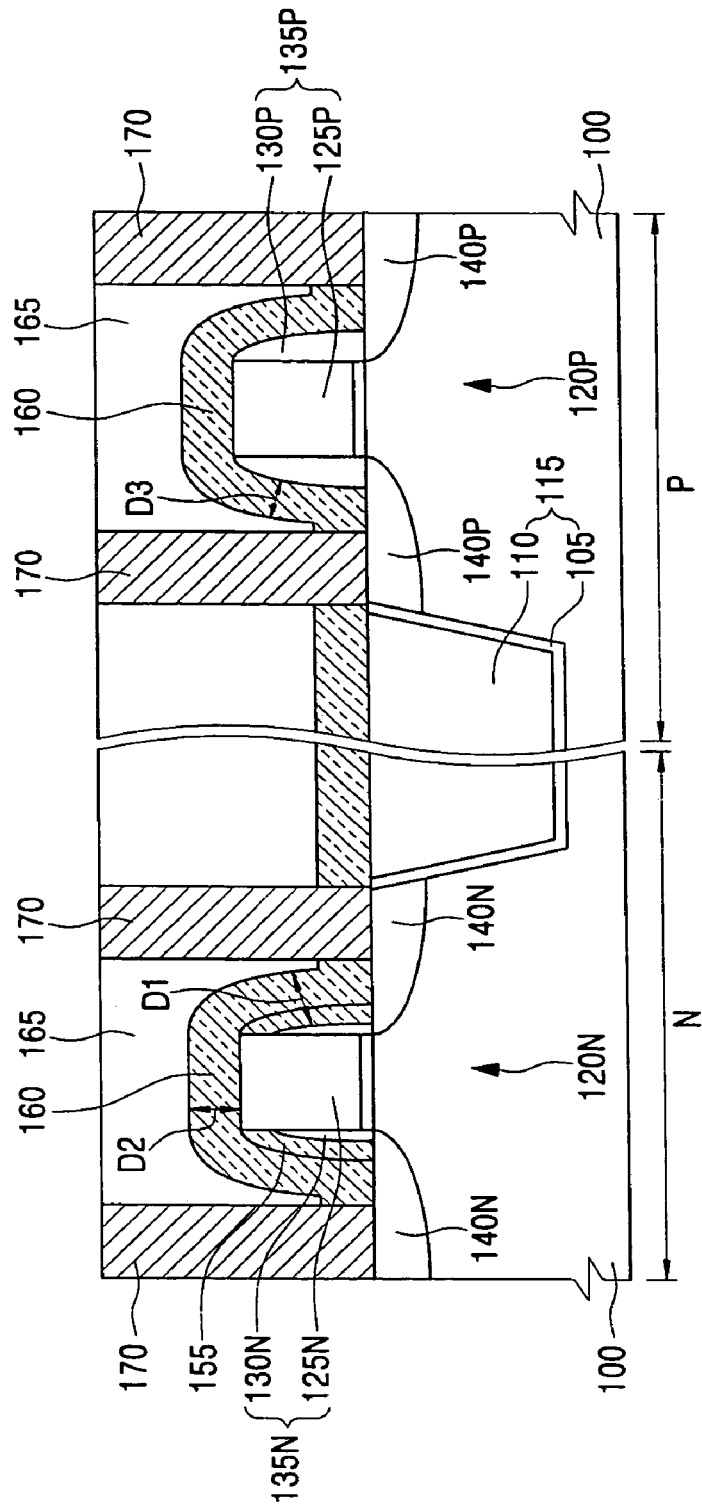

FIG. 8 is a diagram illustrating a sectional view of a semiconductor device according to example embodiments of the present invention.

Referring to FIG. 8, a semiconductor substrate 100 is provided. The semiconductor substrate 100 may have a first region N and a second region P. The first region N may be a NMOS transistor region and the second region P may be a PMOS transistor region P. An isolation layer 115 may be formed in the semiconductor substrate 100 having the NMOS transistor region N and the PMOS transistor region P. The isolation layer 115 may include a liner insulating layer 105 and a buried insulating layer 110, which are stacked. The liner insulating layer 105 may be a silicon nitride layer. The buried insulating layer 110 may be a silicon oxide layer.

Due to the presence of the isolation layer 115, an NMOS active region 120N may be confined to the NMOS transistor region N and a PMOS active region 120P may be confined to the PMOS transistor region P. A first gate electrode 125N may be formed on the NMOS active region 120N and a second gate electrode 125P may be formed on the PMOS active region 120P. A first gate spacer 130N may be formed on the sidewall of the first gate electrode 125N. A second gate spacer 130P may be formed on the sidewall of the second gate electrode 125P. The first gate electrode 125N may be a NMOS gate electrode 125N and the second gate electrode 125P may be a PMOS gate electrode 125P. The first gate spacer 130N may be a NMOS gate spacer 130N and the second gate spacer 130P may be a PMOS gate spacer 130P. A thickness of the NMOS gate spacer 130N may be thinner than the P-MOS gate spacer 130P. The NMOS gate electrode 125N and the NMOS gate spacer 130N may form an NMOS gate pattern 135N. The PMOS gate electrode 125P and the PMOS gate spacer 130P may form a PMOS gate pattern 135P.

First source/drain regions 140N (in other words, the NMOS source/drain regions 140N) may be formed in the NMOS active region 120N at both sides of the NMOS gate electrode 125N. The NMOS source/drain regions 140N may have n-type conductivity.

An auxiliary spacer may be formed around, or surrounding, the NMOS gate spacer 130N. The auxiliary spacer 155 may be selectively formed in the NMOS transistor region N. The auxiliary spacer 155 may be formed of a silicon nitride layer having a desired property of tensile stress.

An etch stop layer 160 may be formed on a surface of the semiconductor substrate 100 having the auxiliary spacer 155 formed thereon. The etch stop layer 160 may be formed of a material having the same stress property as the auxiliary spacer 155. For example, the etch stop layer 160 may be formed of tensile silicon nitride. A total thickness $D_1$, including a thickness of the auxiliary spacer 155 and a thickness of the etch stop layer 160 on the sidewall of the NMOS gate pattern 135N, may be equal to or greater than a thickness $D_2$ of the etch stop layer 160 on an upper surface of the NMOS gate pattern 135N. The thickness $D_1$, including the thickness of the auxiliary spacer 155 and the etch stop layer 160 on the sidewall of the NMOS gate pattern 135N may be greater than a thickness $D_3$ of the etch stop layer 160 on the sidewall of the PMOS gate pattern 135P.

An interlayer insulating layer 165 may be formed on the etch stop layer 160. Contact plugs 170 may be provided to penetrate the interlayer insulating layer 165 and the etch stop layer 160. The contact plugs 170 may be electrically connected to the source/drain regions 140N and 140P. The contact plugs 170 may be a doped polysilicon layer.

FIGS. 1 through 7 are diagrams illustrating sectional views of a method of fabricating a semiconductor device according to example embodiments of the present invention.

Referring to FIG. 1, a semiconductor substrate 100 having a first region N and a second region P may be provided. The first region N may be a NMOS transistor region N and the second region P may be a PMOS transistor region P. An isolation layer 115 may be formed in the semiconductor substrate 100 having the NMOS transistor region N and the PMOS transistor region P. The isolation layer 115 may be formed using, for example, a shallow trench isolation (STI) process. The isolation layer may be formed by any technique or process appreciated in the art. The isolation layer 115 may include a liner insulating layer 105 and a buried insulating layer 110, which are stacked. The liner insulating layer 105 may be a silicon nitride layer. The buried insulating layer 110 may be a silicon oxide layer.

Prior to formation of the liner insulating layer 105, a thermal oxide layer may be formed. An NMOS active region 120N may be confined in the NMOS transistor region N and a PMOS active region 120P may be confined in the PMOS transistor region P. The NMOS active region 120N and the PMOS active region 120P may be confined by the isolation layer 115. A P-well (not shown) may be formed in the semiconductor substrate 100 of the NMOS transistor region N. An N-well (not shown) may be formed in the semiconductor substrate 100 of the PMOS transistor region P. The P-well and the N-well may be formed prior to or after the formation of the isolation layer 115.

Figure 2:
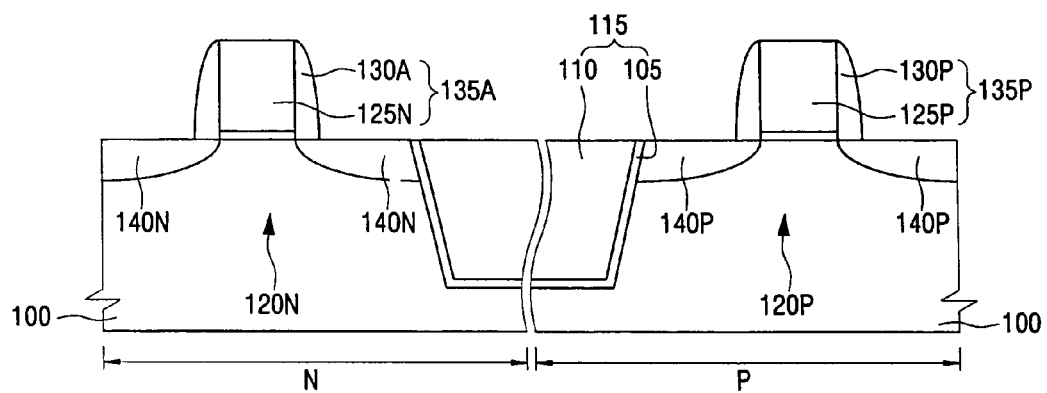

Referring to FIG. 2, a gate electrode layer may be formed on the semiconductor substrate 100 having the isolation layer 115 formed therein. The gate electrode layer may be patterned, forming a first gate electrode 125N on the NMOS region 120N and a second gate electrode 125P on the PMOS active region 120P. Before the gate electrode layer is formed, a gate insulating layer may be formed on the semiconductor substrate 100 having the isolation layer 115 formed therein. The gate insulating layer may be a thermal oxide layer. While the gate electrode layer is patterned, a gate insulating layer may be patterned. The first gate electrode 125N may be an NMOS gate electrode 125N and the second gate electrode 125P may be a PMOS gate electrode 125P. The NMOS gate electrode 125N and the PMOS gate electrode 125P may be formed using alternative processes. The gate electrodes 125N and 125P may be a doped polysilicon layer. The gate electrodes 125N and 125P may be formed to having a metal silicide layer (e.g., a tungsten silicide layer) in addition to the polysilicon layer. Impurities may be implanted into the active regions 120N and 120P at both sides of the gate electrodes 125N and 125P, using the gate electrodes 125N and 125P as ion implantation masks to form lightly doped drain (LDD) regions.

A gate spacer layer may be formed on the semiconductor substrate 100 having the gate electrodes 125N and 125P formed thereon. The gate spacer layer may be uniformly, or conformally, formed on the semiconductor substrate 100. The gate spacer layer may be formed of a silicon nitride layer. The gate spacer layer may be formed using a low pressure chemical vapor deposition (LPCVD) method. The gate spacer layer may be isotropically etched, forming a first preliminary gate spacer 130A on the sidewall of the NMOS gate electrode 125N and a second gate spacer 130P on the sidewalls of the PMOS gate electrode 125P. The first preliminary gate spacer 130A may be a preliminary NMOS gate spacer 130A and the second gate spacer 130P may be a PMOS gate spacer 130P. The NMOS gate electrode 125N and the preliminary NMOS gate spacer 130A may form a preliminary NMOS gate pattern 135A. The PMOS gate electrode 125P and the PMOS gate spacer 130P form a PMOS gate pattern 135P.

A first mask pattern may be formed on the PMOS transistor region P. Using the first mask pattern and the preliminary NMOS gate pattern 135A as ion implantation masks, impurities may be implanted into the NMOS active region 120N, forming first source/drain regions 140N. The first source/drain regions 140N may be NMOS source/drain regions 140N. The impurities may be n-type impurities. The first mask pattern may be removed. A second mask pattern may be formed on the NMOS transistor region N. Using the second mask pattern and the PMOS gate pattern 135P as ion implantation masks, p-type impurities may be implanted into the PMOS active region 120P, forming second source/drain regions 140P. The second source/drain regions 140P may be PMOS source/drain regions 140P. The order of forming the NMOS source/drain regions 140N and the PMOS source/drain regions 140P may be reversed.

Figure 3:
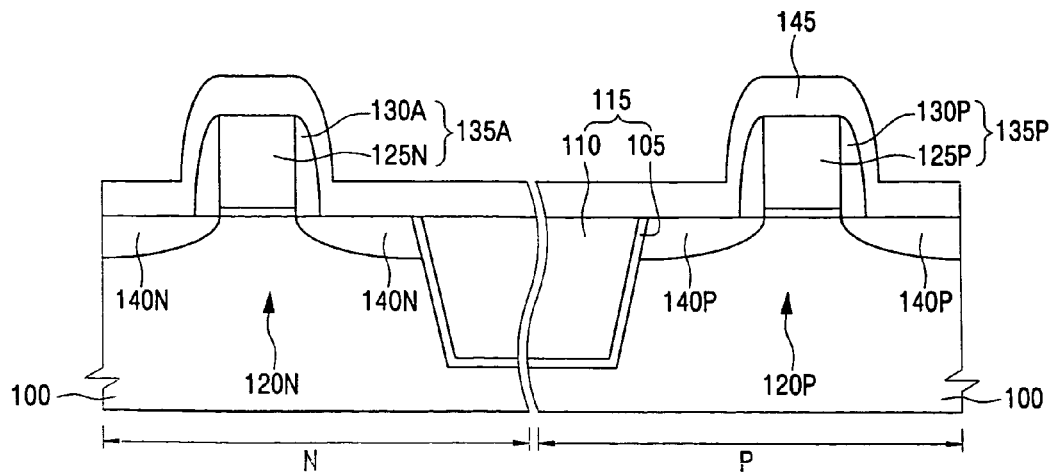

Referring to FIG. 3, a protecting layer 145 may be formed on the semiconductor substrate 100 having the NMOS source/drain regions 140N and the PMOS source/drain regions 140P formed therein. The protecting layer 145 may be formed of a material having an etch selectivity with respect to a silicon nitride layer. For example, the protecting layer 145 may be a high density plasma oxide layer. The protecting layer 145 may be formed such that a portion of the protecting layer 145 on the sidewall of the gate patterns 135A and 135P is formed thinner in thickness than a portion of the protecting layer 145 on the upper surface of the gate patterns 135A and 135P. The thickness of the portion of the protecting layer 145 on the upper surface of the gate patterns 135A and 135P may be determined by the step coverage characteristics of the protecting layer 145.

Figure 4:
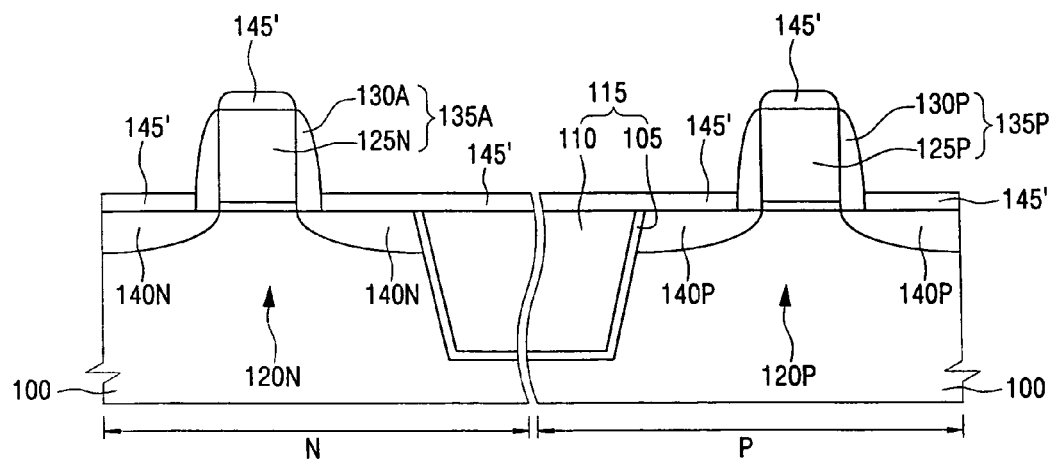

Referring to FIG. 4, the protecting layer 145 may be isotropically etched, forming a protecting pattern 145' exposing the preliminary NMOS gate spacer 130A. The portions of the protecting layer 145 on the upper surface of the preliminary NMOS gate pattern 135A, the upper surface of the semiconductor substrate 100 at both sides of the preliminary NMOS gate pattern 135A and the isolation layer 115 may remained after the isotropic etch process due to a relatively thin portion of the protecting layer 145 remaining on the sidewall of the preliminary NMOS gate pattern 135A. Only the portion of the protecting layer 145 on the sidewall of the preliminary NMOS gate pattern 135A may be selectively removed. The protecting layer 145 on the sidewall of the preliminary PMOS gate pattern 135P may be removed.

Figure 5:
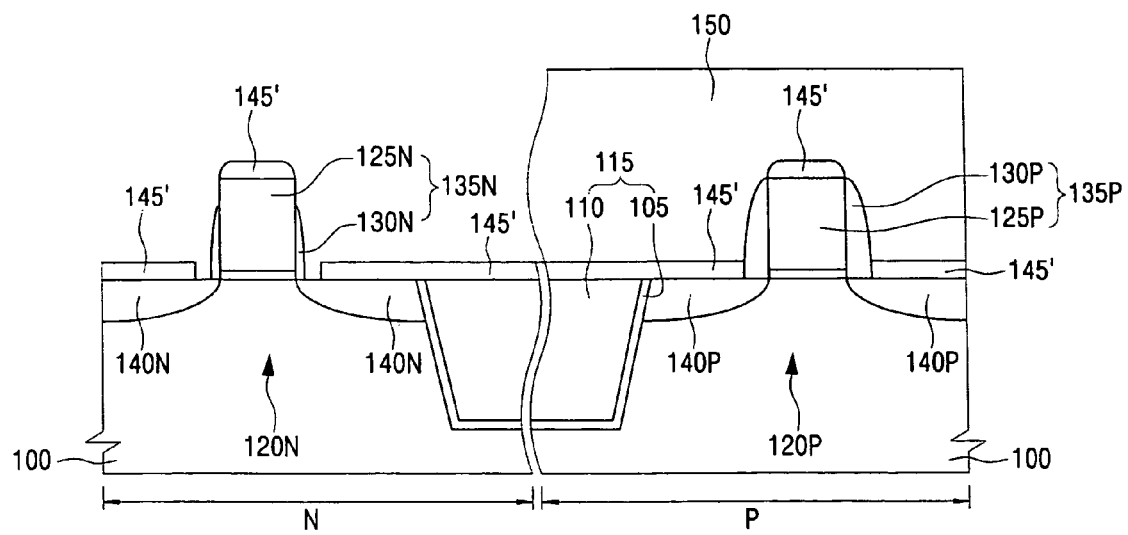

Referring to FIG. 5, an NMOS gate spacer 130N having a relatively thin thickness may be formed by etching the preliminary NMOS gate spacer 130A. Alternatively, the preliminary NMOS gate spacer 130A may be reduced, or removed, by etching. The etch process may be an isotropic etch process. Prior to the etch process, a third mask pattern 150 (e.g., a photoresist pattern) may be formed on the PMOS region P such that the PMOS gate spacer 130P is not etched. Because the protecting pattern 145' may be formed on the isolation layer 115, the liner insulating layer 105 of the isolation layer 115 may be protected without damage during the etch process. The third mask pattern 150 and the protecting pattern 145' may be sequentially removed.

Figure 6:
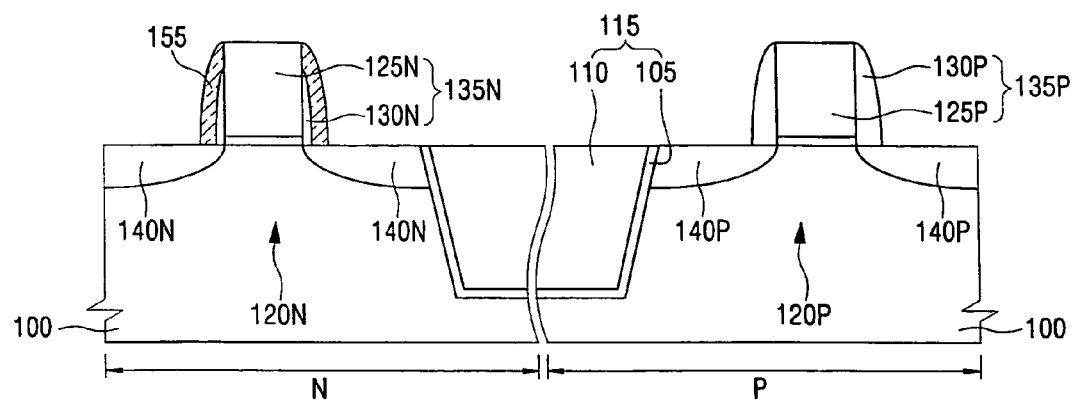

Referring to FIG. 6, an auxiliary spacer layer may be formed on the surface of the semiconductor substrate 100 having the NMOS gate spacer 130N formed thereon. The auxiliary spacer layer may be a tensile silicon nitride layer. The auxiliary spacer layer may be formed using a PECVD method. During the PECVD process, variables (e.g., power, compositions of reaction gases or the like) may be adjusted such that the silicon nitride layer may have a desired tensile stress property. The auxiliary spacer layer may be etched, forming an auxiliary spacer 155 surrounding the NMOS gate spacer 130N. The auxiliary spacer 155 may be selectively formed in the NMOS region N.

In example embodiments of the present invention, a thickness of the auxiliary spacer 155 may be increased according to a decrease in the thickness of the preliminary NMOS gate spacer 130A by etching. For example, the thickness of the auxiliary spacer 155 may be controlled in accordance with the decreased thickness of the preliminary NMOS gate spacer 130A. In other example embodiments of the present invention, when the preliminary NMOS gate spacer 130A is completely removed, the auxiliary spacer 155 may be formed at the position where the preliminary NMOS gate spacer 130A is removed.

Figure 7:
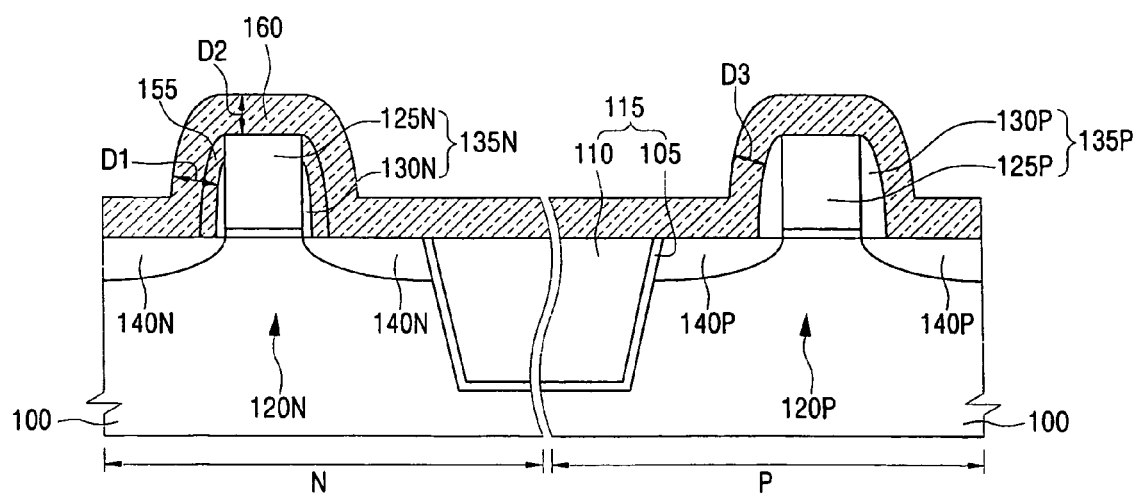

Referring to FIG. 7, an etch stop layer 160 may be formed on the semiconductor substrate 100 having the auxiliary spacer 155.

The etch stop layer 160 may be formed of a material having the same stress property as the auxiliary spacer 155. For example, the etch stop layer 160 may be formed of tensile silicon nitride. The etch stop layer 160 may be formed using a PECVD method. Similar to the auxiliary spacer 155, during the PECVD process, variables (e.g., power, compositions of reaction gases or the like) may be adjusted such that the etch stop layer 160 may have a desired tensile stress property.

When the etch stop layer 160 has the desired tensile stress property, a tensile stress may be applied to a channel region formed between the NMOS source/drain regions 140N. Mobility of the electrons flowing through the channel region may increase. In example embodiments of the present invention, after the auxiliary spacer 155 is formed on the sidewall of the NMOS gate pattern 135N, the etch stop layer 160 may be formed to have a same stress property as the auxiliary spacer 155. The etch stop layer 160 may be formed using a PECVD process as described above. Because the material layer formed by the PECVD process may have undesirable step coverage characteristics, a thickness of the portion of the etch stop layer 160 on the sidewall of the NMOS gate pattern 135N may be formed thinner than the portion of the etch stop layer 160 on the upper surface of the NMOS gate pattern 135N. The presence of the auxiliary spacer 155 may allow for the sidewall thickness of the etch stop layer 160. A thickness $D_1$, including the thickness of the auxiliary spacer 155 and the thickness of the etch stop layer 160 on the sidewall of the NMOS gate pattern 135N, may be equal to or greater than a thickness $D_2$ of the etch stop layer 160 on the upper surface of the NMOS gate pattern 135N. The thickness $D_1$, including the thickness of the auxiliary spacer 155 and the thickness of etch stop layer 160 on the sidewall of the NMOS gate pattern 135N, may be greater than a thickness $D_3$ of the etch stop layer 160 on the sidewall of the PMOS gate pattern 135P.

In other example embodiments, after the etch stop layer 160 is formed, ions capable of alleviating a tensile stress property of the etch stop layer 160 may be implanted into the etch stop layer 160 in the PMOS transistor region P using an ion implantation method. The ions may be germanium (Ge) ions. Alternatively, the etch stop layer 160 in the PMOS transistor region P may be selectively removed, forming an etch stop layer having a compressive stress property.

Referring to FIG. 8, an interlayer insulating layer 165 may be formed on the etch stop layer 160. The interlayer insulating layer 165 may be formed of a material having an etch selectivity with respect to the etch stop layer 160. For example, when the etch stop layer 160 is formed of a tensile silicon nitride as described above, the interlayer insulating layer 165 may be formed of silicon oxide. The interlayer insulating layer 165 and the etch stop layer 160 may be sequentially patterned, forming contact holes penetrating the interlayer insulating layer 165 and the etch stop layer 160. A conductive layer may be formed to fill the contact holes. The conductive layer may be a doped polysilicon layer. The conductive layer may be planarized, forming contact plugs 170 filling the contact holes and electrically connected to the source/drain regions 140N and 140P.

As described above, according to example embodiments of the present invention, the auxiliary spacer may be formed on the sidewall of the gate electrode. The etch stop layer may be formed to have a relatively stronger stress property. The presence of the auxiliary spacer may allow for the thickness of the etch stop layer on the sidewall of the gate electrode, providing increased transistor characteristics.

The foregoing is illustrative of the example embodiments of the present invention and is not to be construed as limiting thereof. Although a few example embodiments of the present invention have been described, those skilled in the art will readily appreciate that many modifications are possible in the example embodiments without materially departing from the novel teachings and advantages of the present invention. Accordingly, all such modifications are intended to be included within the scope of this invention as defined in the claims. In the claims, means-plus-function clauses are intended to cover the structures described herein as performing the recited function, and not only structural equivalents but also equivalent structures. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The present invention is defined by the following claims, with equivalents of the claims to be included therein.

What is claimed is:

1. A semiconductor device comprising:
    a substrate having an NMOS region and a PMOS region;
    a first gate electrode on the substrate of the NMOS region;
    a second gate electrode formed to be spaced apart from the first gate electrode on the substrate of the PMOS region;
    an auxiliary spacer on a sidewall of the first gate electrode, wherein the auxiliary spacer is selectively formed in the NMOS region, wherein the auxiliary spacer is not formed on an upper surface of the first gate electrode;
    a second gate spacer on a sidewall of the second gate electrode, wherein a stress property of the second gate spacer is different from a stress property of the auxiliary spacer, wherein the second gate spacer is not formed on an upper surface of the second gate electrode; and
    an etch stop layer on the substrate having the auxiliary spacer and the second gate spacer, wherein the etch stop layer and the auxiliary spacer are formed of a material having a same stress property.

2. The semiconductor device according to claim 1, further comprising a first gate spacer interposed between the first gate electrode and the auxiliary spacer,
    wherein the first gate spacer is formed of the same material as the second gate spacer, and
    a stress property of the first gate spacer is different from a stress property of the auxiliary spacer.

3. The semiconductor device according to claim 1, further comprising first source/drain regions formed in the substrate at sides of the first gate electrode.

4. The semiconductor device according to claim 3, wherein the first source/drain regions have n-type conductivity.

5. The semiconductor device according to claim 1, wherein the auxiliary spacer and the etch stop layer are formed of tensile silicon nitride.

6. The semiconductor device according to claim 1, wherein a total thickness, including a thickness of the auxiliary spacer and a thickness of the etch stop layer on the sidewall of the first gate electrode, is equal to or greater than a thickness of the etch stop layer on the upper surface of the first gate electrode.

7. The semiconductor device according to claim 1,
    wherein the etch stop layer and the auxiliary spacer are formed using a plasma enhanced chemical vapor deposition method, and
    wherein the second gate spacer is formed using a low pressure chemical vapor deposition method.

8. The semiconductor device according to claim 1, further comprising second source/drain regions formed in the substrate at sides of the second gate electrode, wherein the second source/drain regions have p-type conductivity.

9. A method of fabricating a semiconductor device, comprising:
    forming a first gate electrode on a substrate;
    forming a preliminary gate spacer on a sidewall of the first gate electrode;
    forming a protecting layer on the substrate having the preliminary gate spacer formed thereon;
    partially etching the protecting layer to expose the preliminary gate spacer;
    etching the exposed preliminary gate spacer to reduce or remove the preliminary gate spacer;
    after etching the exposed preliminary gate spacer, forming an auxiliary spacer on the sidewall of the first gate electrode; and
    forming an etch stop layer on the substrate having the auxiliary spacer formed thereon, wherein the etch stop layer and the auxiliary spacer are formed of a material having a same stress property.

10. The method according to claim 9, further comprising forming an isolation layer including a liner insulating layer in the substrate, prior to forming the first gate electrode, wherein the liner insulating layer is formed of silicon nitride.

11. The method according to claim 9, wherein the protecting layer is formed of silicon oxide.

12. The method according to claim 11, further comprising removing the protecting layer, prior to forming the etch stop layer.

13. The method according to claim 9, wherein the preliminary gate spacer is formed using a low pressure chemical vapor deposition (LPCVD) method.

14. The method according to claim 9, wherein the auxiliary spacer and the etch stop layer form a tensile silicon nitride layer.

15. The method according to claim 9, wherein the auxiliary spacer and the etch stop layer are formed using a plasma enhanced chemical vapor deposition (PECVD) method.

16. The method according to claim 9, wherein a total thickness, including a thickness of the auxiliary spacer and a thickness of the etch stop layer on the sidewall of the first gate electrode, is equal to or greater than a thickness of the etch stop layer on an upper surface of the first gate electrode.

17. The method according to claim 9, further comprising forming source/drain regions in the substrate at both sides of the first gate electrode, prior to forming the auxiliary spacer.

18. The method according to claim 17, wherein the source/drain regions have n-type conductivity.

19. The method according to claim 9, further comprising forming a second gate electrode on a different region of the substrate than the first gate electrode.

20. The method according to claim 19, further comprising:
forming a second gate spacer on a sidewall of the second gate electrode, prior to etching the preliminary gate spacer, wherein a stress property of the second gate spacer is different from a stress property of the auxiliary spacer.

21. The method according to claim 19, wherein the auxiliary spacer and the etch stop layer are formed of tensile silicon nitride.

22. The method according to claim 19, further comprising forming first source/drain regions in the substrate at both sides of the first gate electrode and forming second source/drain regions in the substrate at both sides of the second gate electrode, wherein the first source/drain regions have n-type conductivity and the second source/drain regions have p-type conductivity.

23. A method of fabricating a semiconductor device, comprising:
forming an isolation layer to define an NMOS active region and a PMOS active region in a substrate;
forming an NMOS gate electrode on the NMOS active region of the substrate;
forming a PMOS gate electrode on the PMOS active region of the substrate;
forming a gate spacer layer on the substrate having the NMOS and PMOS gate electrodes;
etching the gate spacer layer, and forming an NMOS preliminary gate spacer on the sidewall of the NMOS gate electrode and a PMOS gate spacer on the sidewall of the PMOS gate electrode;
forming a protecting layer on the substrate having the NMOS preliminary gate spacer and the PMOS gate spacer, wherein the protecting layer is formed of a material having an etch selectivity with respect to the gate spacer layer;
partially etching the protecting layer to expose the NMOS preliminary gate spacer and the PMOS gate spacer;
forming a mask pattern to expose the NMOS preliminary gate spacer and cover the PMOS gate spacer;
etching the exposed NMOS preliminary gate spacer to reduce or remove the NMOS preliminary gate spacer;
removing the mask pattern;
after etching the exposed NMOS preliminary gate spacer, selectively forming an auxiliary spacer on a sidewall of the NMOS gate electrode; and
forming an etch stop layer on the substrate having the auxiliary spacer formed thereon, wherein the etch stop layer and the auxiliary spacer are formed of a material having a same stress property.

24. The method according to claim 23, further comprising, removing the partially etched protecting layer, prior to forming the etch stop layer.

* * * * *